United States Patent [19]

Hirai

[11] Patent Number: 5,493,477
[45] Date of Patent: Feb. 20, 1996

[54] IC CARD DEVICE

[75] Inventor: Yuji Hirai, Tokyo, Japan

[73] Assignee: Honda Tsushin Kogyo Kabushiki Kaisha, Tokyo, Japan

[21] Appl. No.: 271,644

[22] Filed: Jul. 7, 1994

[30] Foreign Application Priority Data

Sep. 10, 1993 [JP] Japan .................................. 5-049401 U

[51] Int. Cl.⁶ ................................................. H05K 1/14
[52] U.S. Cl. ........................ 361/737; 361/752; 361/796; 174/17 R; 439/374; 257/679
[58] Field of Search ................................ 361/737, 728, 361/752, 756, 759, 802; 235/380, 441; 174/17 R, 260; 257/679; 439/377, 374, 44, 74

[56] References Cited

U.S. PATENT DOCUMENTS

| Re. 34,369 | 9/1993 | Darden et al. .................... 439/377 |
| 4,810,200 | 3/1989 | Sakamoto ............................ 439/155 |
| 5,313,344 | 5/1994 | Omori et al. ....................... 361/737 |
| 5,333,100 | 7/1994 | Anhalt et al. ...................... 361/818 |
| 5,338,210 | 8/1994 | Beckham et al. .................. 439/131 |

Primary Examiner—Leo P. Picard
Assistant Examiner—Y. Whang
Attorney, Agent, or Firm—Armstrong, Westerman, Hattori, McLeland & Naughton

[57] ABSTRACT

An IC card device has a frame, a print circuit board which is supported by the frame and on which are mounted electronic parts such as IC's or the like, as well as connectors, and a pair of electrically conductive covers which cover front and rear surfaces of the print circuit boards and which are fixed to the frame. The electrically conductive covers have elasticity and channel shaped bent portions at least on both side edges thereof. The frame has tapered surfaces at least in both external side corner portions thereof as well as slits on both external side surfaces thereof. Both side edges of the channel shaped bent portions are caused to slide, when the electrically conductive covers are pressed towards each other, along the tapered surfaces into engagement with the slits.

2 Claims, 3 Drawing Sheets

IC CARD DEVICE

BACKGROUND OF THE INVENTION

1. Field of the Invention

The present invention relates to an IC card device to be used in an IC memory card, a communication card, or the like.

2. Description of Related Art

A conventional IC card device is made up of a frame, a print circuit board which is supported by the frame and on which are mounted connectors as well as electronic parts such as an IC card or the like, and a pair of electrically conductive covers which cover both front and rear surfaces of the print circuit board and which are fixed to the frame. As shown in FIG. 4, the pair of the electrically conductive covers $a_1$, $a_2$ are bent at right angles at their both side edges. In a condition in which the electrically conductive covers are overlapped with the frame, the front ends of both side edges of one $a_1$ of the electrically conductive covers and the front ends b of both side edges of the other $a_2$ thereof are welded together so as to fix both covers to the frame.

In the above-described conventional IC card device, the pair of electrically conductive covers $a_1$, $a_2$ are welded together to fix them to the frame. Therefore, there are disadvantages in that its assembling takes time and that the assembling can be made only in a place where a welding machine is available.

SUMMARY OF THE INVENTION

The present invention has been made in view of the above-described disadvantages of the conventional IC card device. It has an object of providing an IC card device the assembling of which is easy and is not time-consuming and which can be easily assembled even by a person not well trained for that particular purpose by employing a handy assembling tool.

In order to attain the above and other objects, the present invention is an IC card device having a frame, a print circuit board which is supported by the frame and on which are mounted electronic parts such as IC's or the like as well as connectors, and a pair of electrically conductive covers which cover front and rear surfaces of said print circuit boards and which are fixed to the frame, wherein the electrically conductive covers have elasticity and c-shaped or channel shaped bent portions at least on both side edges thereof, and wherein the frame has tapered surfaces at least in both external side corner portions thereof as well as slits on both external side surfaces thereof, such that both side edges of the channel shaped bent portions are caused to slide, when the electrically conductive covers are pressed towards each other, along the tapered surfaces into engagement with the slits, whereby the electrically conductive covers are fixed to the frame.

Preferably, in the IC card device the connectors are disposed at a front end portion and a rear end portion, respectively, of the frame.

The electrically conductive covers have elasticity and the frame has formed therein the tapered surfaces in the external corner portions. Therefore, when the electrically conductive covers are pressed towards each other in a condition in which they are overlapped with the frame (or they are placed in contact with the front and rear surfaces, respectively, of the frame), the channel shaped bent portions of the electrically conductive covers are bent or flexed, and the channel shaped both side edges are caused to slide along the tapered surfaces of the frame. The front ends of the channel shaped both side edges are brought into engagement with the slits on both side surfaces of the frame, thereby fixing the electrically conductive covers to the frame.

BRIEF DESCRIPTION OF THE DRAWINGS

The above and other objects and the attendant advantages of the present invention will become readily apparent when by reference to the following detailed description when considered in conjunction with the accompanying drawings wherein.

DETAILED DESCRIPTION OF A PREFERRED EMBODIMENT

Figure 1A:
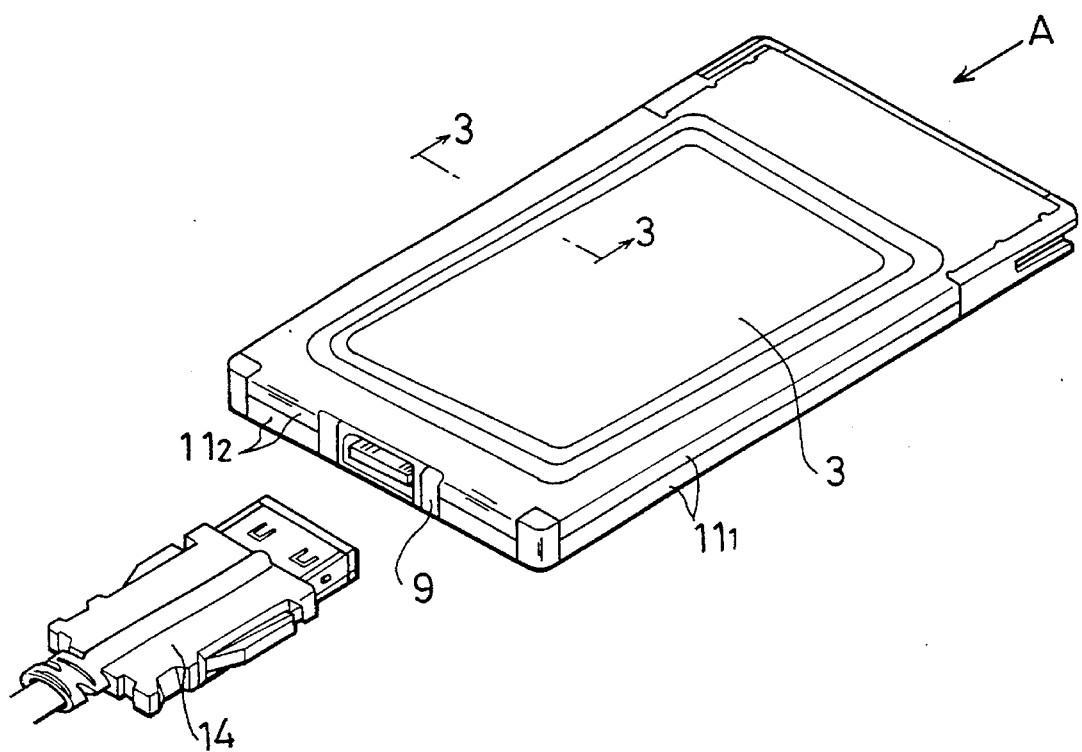
FIG. 1A is a perspective view of an embodying example of an IC card device of the present invention.
Figure 1B:
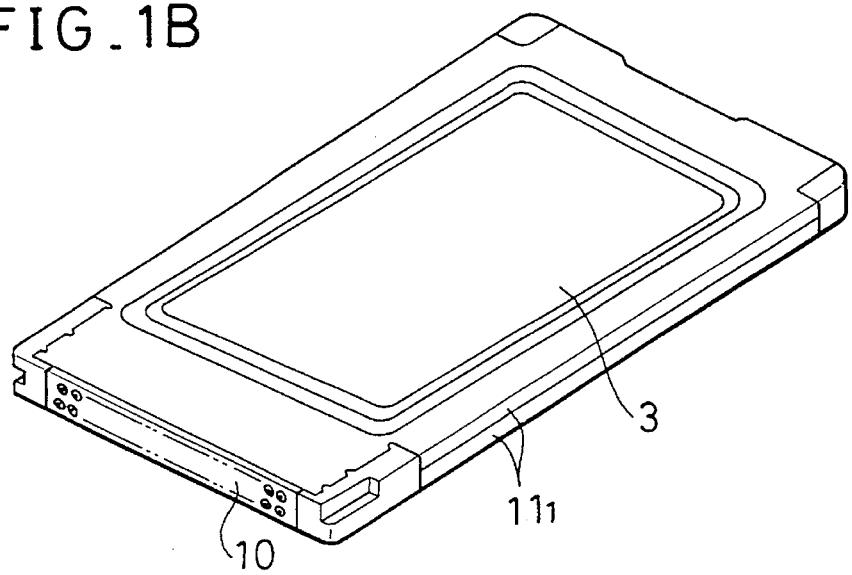
FIG. 1B is a perspective view thereof viewed from an arrow A in FIG. 1A.
Figure 2:
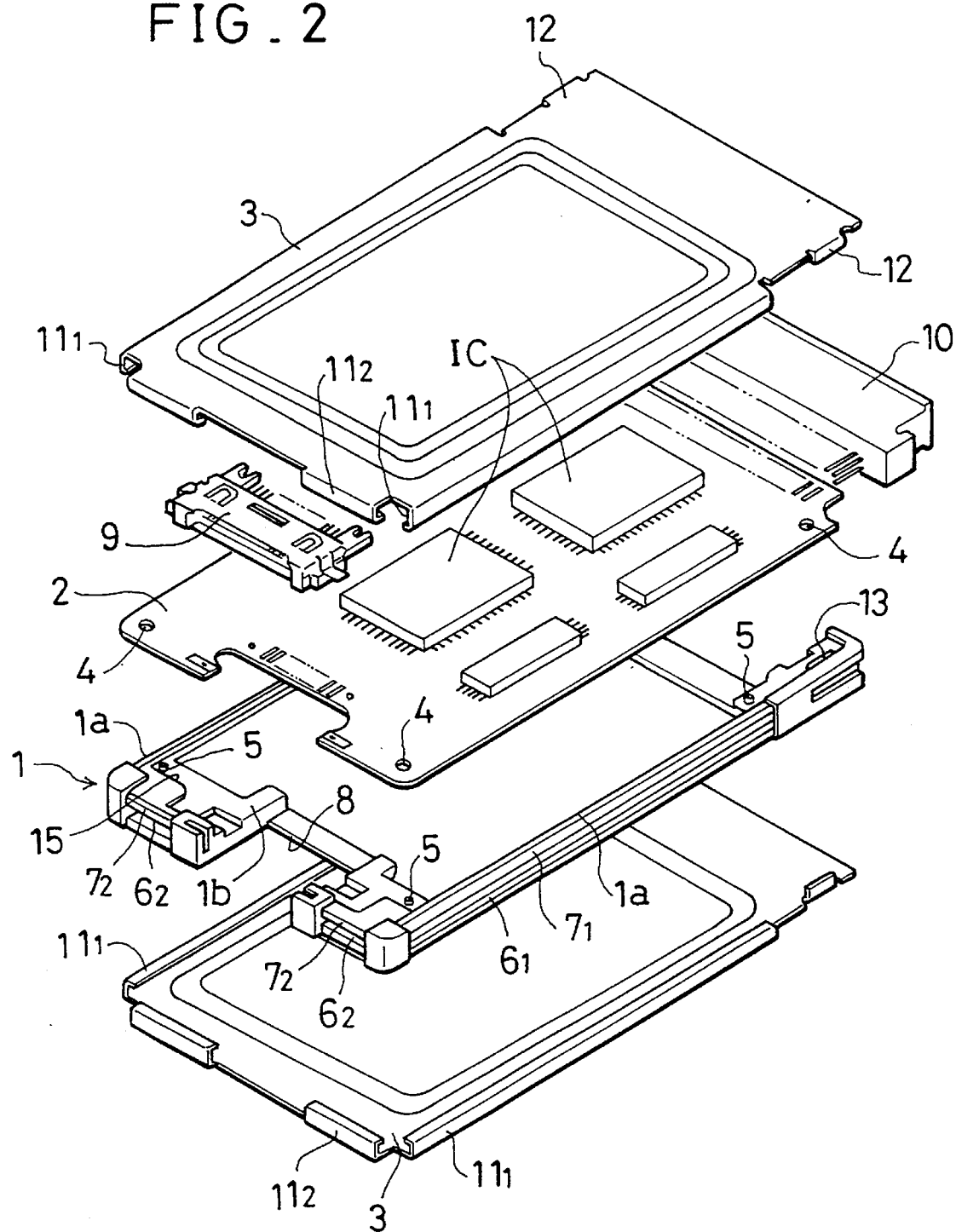
FIG. 2 is an exploded perspective view of the above-described embodiment.

An explanation will now be made about an embodying example of the present invention which is applied to a communication card for use in facsimile modem (modulator and demodulator), LAN (local area network), or the like.

In FIGS. 1A, 1B, 2, 3A and 3B, numeral 1 denotes a frame of, e.g., synthetic resin, numeral 2 denotes a print circuit board and numerals 3, 3 denote electrically conductive covers.

The frame 1 has stepped portions 15 for engaging the print circuit board 2 therewith. The stepped portions are formed on upper surfaces of a pair of elongated pieces 1a, 1a on the right and left sides of the frame 1, as well as on an upper surface of a connecting piece 1b which connects the elongated pieces 1a, 1a together at their front ends. On a lower surface of the stepped portions there are formed four pieces of projections 5, 5 with which holes 4 in the print circuit board 2 come into engagement. On outer side surfaces of the pair of elongated pieces 1a, 1a, there are formed slits $6_1$, $6_1$. In corner portions of outer surfaces of the pair of elongated pieces 1a, 1a, there are formed tapered surfaces $7_1$, $7_1$. In the connecting piece 1b there is formed a recessed portion 8 for inserting thereinto a connector. On those corner portions of the side surfaces of the connecting piece 8 which are positioned on both sides of the connecting piece 1b, there are formed tapered surfaces $7_2$, $7_2$.

The above-described print circuit board 2 has mounted thereon IC's (integrated circuits) for a CPU (central processing unit), a memory or the like, as well as connectors 9, 10.

The above-described electrically conductive covers 3, 3 are made, for example, of a stainless steel (SUS304). Each of the covers 3, 3 has formed therein channel shaped bent portions $11_1$, $11_1$ so as to extend over most of the side edges as well as channel shaped bent portions $11_2$, $11_2$ so as extend over two portions of the front edges thereof. On the remaining portions of both side edges of each of the covers 3, 3 there are formed claw pieces 12, 12 which are bent at right angles.

Figure 3A:
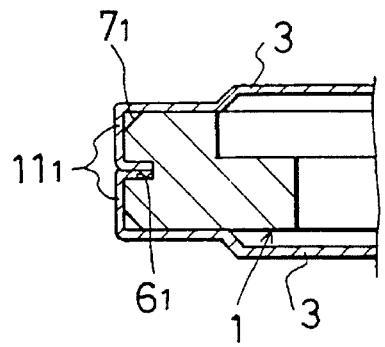
FIG. 3A is a sectional view viewed from the line 3—3 in FIG. 1A.
Figure 3B:
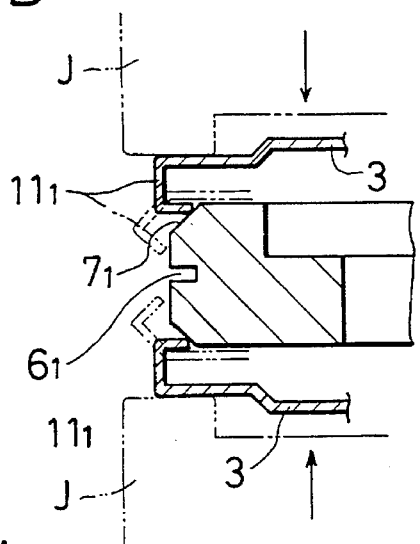
FIG. 3B is a sectional view thereof showing the process of assembling.
Figure 4:
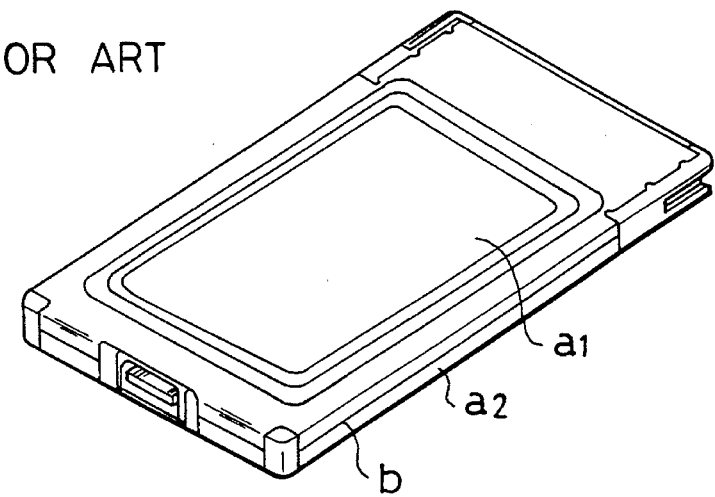
FIG. 4 is a perspective view of a conventional IC card device.

In assembling the above-described parts into an IC card device, the following steps are taken. Namely, the print circuit board 2 is placed in position by engaging it with the lower surface of the stepped portion on the face of the frame 1. The connectors 9, 10 are fitted into the front end and the rear end, respectively, of the frame 1. Then, the electrically conductive covers 3 are overlapped (or are placed in slight contact) with the front and rear surfaces of the frame 1, as shown in FIG. 3B. Thereafter, they are mounted on an assembly jig J to press the upper and the lower electrically conductive covers 3, 3 towards each other. As shown by dotted lines in FIG. 3B, the channel shaped bent portions $11_1$, $11_1$ on both side edges and the channel shaped bent portions $11_2$, $11_2$ on the front edges, respectively, of the electrically conductive covers 3, 3 are caused, while being forced to bend or flex, to slide along the tapered surfaces $7_1$, $7_1$ and $7_2$, $7_2$ and are finally caused to be brought into engagement with the slits $6_1$, $6_1$ and $6_2$, $6_2$, respectively. The claw pieces 12, 12 are fitted into slits 13, 13 in the frame 1.

In FIG. 1A, numeral 14 denotes a mating connector which is connected to the connector 9.

In the above-described embodying example, there are formed channel shaped bent portions $11_2$, $11_2$ on the front edges of the electrically conductive covers 3, 3. It is, however, needless to say that these bent portions need not be formed in case the connector 9 is small in its width.

As described above, since the present invention has the above-described construction, its assembly is easy and can be finished in a shorter time than a conventional one. Further, it can be easily assembled by any person not well trained for that particular purpose with a handy assembling tool.

It is readily apparent that the above-described IC card device meets all of the objects mentioned above and has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. An IC card device having a frame, a print circuit board which is supported by said frame and on which are mounted electronic parts such as IC's and connectors, and a pair of electrically conductive covers which cover front and rear surfaces of said print circuit boards and which are fixed to said frame, wherein said electrically conductive covers have elasticity and channel shaped bent portions at least on both side edges thereof, and wherein said frame has tapered surfaces at least in both external side corner portions thereof and slits on both external side surfaces thereof, such that both side edges of said channel shaped bent portions are caused to slide, when said electrically conductive covers are pressed towards each other, along said tapered surfaces into engagement with said slits, whereby said electrically conductive covers are fixed to said frame.

2. An IC card device according to claim 1, wherein said connectors are disposed at a front end portion and a rear end portion, respectively, of said frame.

* * * * *